United States Patent [19]

Kiko

[11] 3,846,712

[45] Nov. 5, 1974

[54] DIFFERENTIAL AMPLIFIER WITH DYNAMIC BIASING

[75] Inventor: Frederick John Kiko, Sheffield Village, Ohio

[73] Assignee: Bell Telephone Laboratories, Incorporated, Murray Hill, Berkeley Heights, N.J.

[22] Filed: Mar. 12, 1973

[21] Appl. No.: 340,267

[52] U.S. Cl................. 330/30 D, 330/40, 332/11 D

[51] Int. Cl............................................... H03f 3/68

[58] Field of Search......... 330/30 D, 69, 29, 22, 40, 330/136; 332/11 D; 325/38 R, 38 B, 41

[56] References Cited

UNITED STATES PATENTS

| | | | |
|---|---|---|---|
| 3,497,824 | 2/1970 | Gourdman | 330/30 D |
| 3,521,179 | 7/1970 | Blancke | 330/40 X |

OTHER PUBLICATIONS

Younge, "Bootstrapping Bias Supply Increases IC Voltage Capacity," Electronics, Oct. 28, 1968, pp. 90, 91.

"MA709C High Performance Operational Amplifier" Fairchild Semiconductor Publication, Oct. 1965.

*Primary Examiner*—James B. Mullins
*Attorney, Agent, or Firm*—John P. McDonnell; Daniel D. Dubosky

[57] ABSTRACT

The differential amplifier current folder and coder circuit of the present invention is dynamically biased in accordance with the magnitude of the input signal to the differential amplifier. The biasing current through the main coding paths of the folder circuitry is thus reduced for lower magnitude input signals, and the coding error introduced due to resistor variations (i.e., IΔR voltage drops) and transistor base currents varies in accordance with the magnitude of the input signal rather than remaining a constant due to the presence of a constant biasing current. Lower magnitude input signals can thus be coded with a minimum of error using either thin film techniques or components readily available from commercial sources.

7 Claims, 1 Drawing Figure

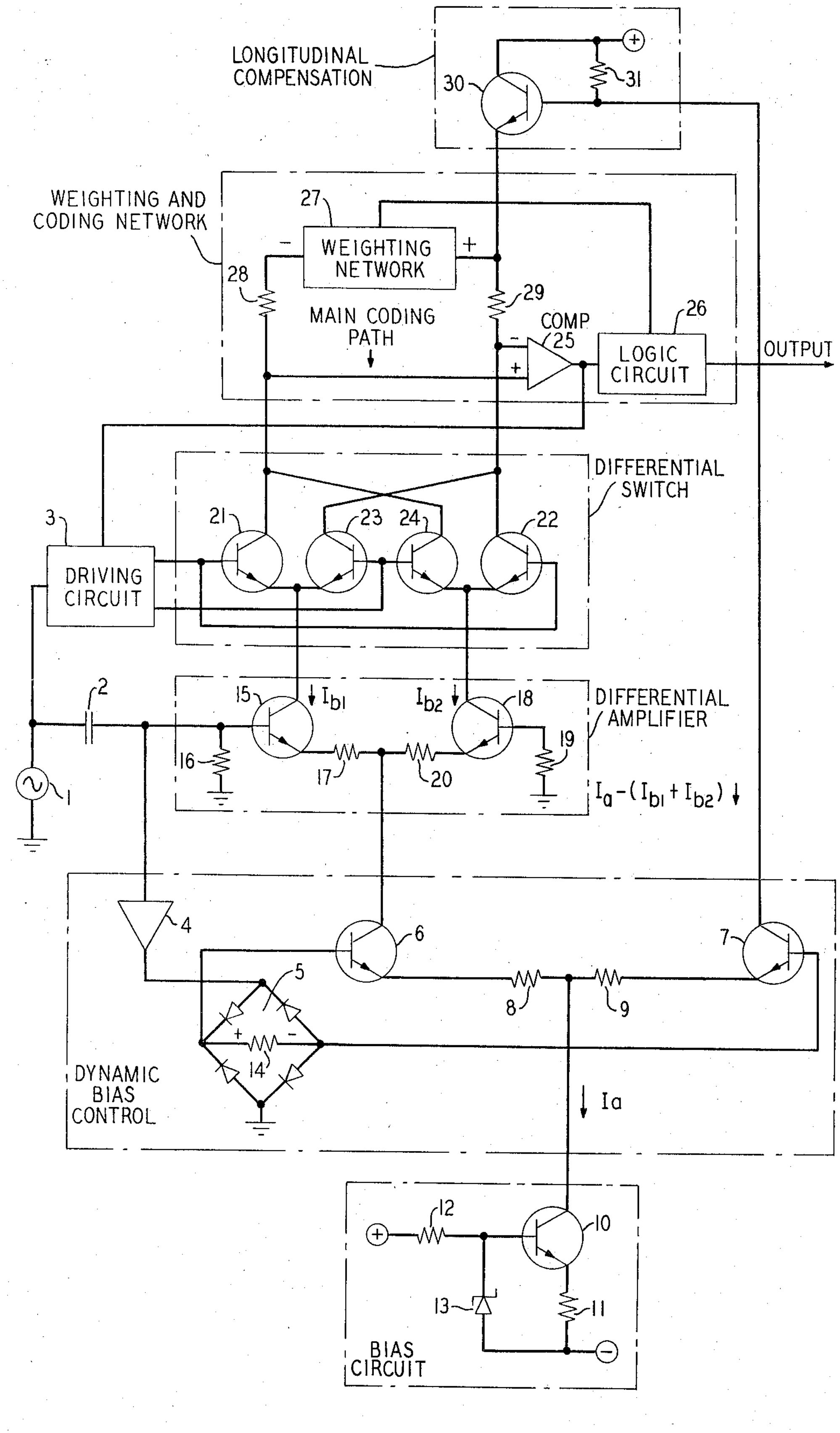
LONGITUDINAL COMPENSATION
30
31
WEIGHTING AND CODING NETWORK
27
WEIGHTING NETWORK
28
29
MAIN CODING PATH
COMP
25
26
LOGIC CIRCUIT
OUTPUT
DIFFERENTIAL SWITCH
21
23
24
22
3
DRIVING CIRCUIT
2
15
$I_{b1}$
$I_{b2}$
18
DIFFERENTIAL AMPLIFIER
16
17
20
19
1
$I_a-(I_{b1}+I_{b2})$
4
6
7
5
8
9
14
DYNAMIC BIAS CONTROL
Ia
12
10
13
11
BIAS CIRCUIT

DIFFERENTIAL AMPLIFIER WITH DYNAMIC BIASING

BACKGROUND OF THE INVENTION

This invention relates to differential amplifier circuits and more particularly to differential amplifier circuits adapted for use in current switched folder and coder circuits.

In PCM (pulse code modulation) communications systems, continuous time varying information signals such as electrical speech signals may be represented by a series of ON and OFF pulses. The analog to digital conversion is accomplished by periodically sampling, quantizing, and encoding the amplitude of each of the samples into binary code words. In the quantizing process the exact level of the time varying input signal is approximated by one of a number of discrete values called quantum levels. The difference between the instantaneous value of the input signal and the quantum level actually transmitted is called quantizing error and gives rise to what is known as quantizing distortion.

Quantizing distortion is especially objectionable and very often intolerable when the instantaneous value or magnitude or the input signal is small but is usually of little or no significance when the instantaneous magnitude of the input signal is high. For higher quality and more effective transmission it is therefore desirable to have significantly more samples of the lower amplitudes of the lower input signal and relatively less samples at the higher amplitudes of the input signal. The undesirable effects of quantizing error are thus reduced by reducing the magnitude of the quantizing error for lower magnitudes of the input signal where quantizing distortion would be a serious matter at the price of increased quantizing error for the higher amplitudes of the input signal where the increased distortion can be tolerated.

Since the input analog signals to be coded are normally symmetrical around the zero or time axis, further quantizing accuracy and simplification can be obtained by "folding" one portion of the input signal about the zero axis in a manner similar to which a full wave rectifier folds negative half sinusoids of the a.c. input signal between positive half sinusoid inputs. The advantages of folding are obvious. For example, for a coder having 256 non-equal quantum levels and a peak signal of +3 to −3 volts, folding the negative portions of the input signal permits the use of only 128 levels (plus polarity) to code a signal over a range of 3 volts (0 to +3 volts) rather than generating 256 levels to code the signal over a range of 6 volts (+3 to −3 volts).

A folder circuit that might be employed for this folding and coding process would employ a constant current source bias circuit, a differential amplifier, a differential switch, and a matched resistor-weighting network structure all connected in a serial path. The input signal to be coded would be connected to the differential amplifier and the output, which is connected to a comparator and logic circuit, would be taken from the weighting network-resistor combination. The weighting network might typically be a resistive ladder network controlled by the logic circuit to provide stepped voltage or current references against which the signals across the matched resistors are compared for coding purposes. The differential switch is driven by a network synchronized and zero set with the polarity and frequency of the input signal to provide the desired folding action. Since the current through the resistor-weighting network combination, differential switch, and differential amplifier is always constant, any variations between the matched components, such as variations in resistance between the matched resistors of the coding network, introduces an error in the folding process which is constant (i.e., the constant biasing current times the $\Delta R$ variations in the resistors produces a $\Delta V$ error voltage.). This constant error presents no problem for input signals of larger magnitudes where the distortion can be tolerated but is quite serious for lower magnitudes of input signals, as discussed heretofore in connection with quantizing error.

The ability to code lower magnitudes of input signal requires that the error introduced by the folding and coding process necessarily be limited to voltage magnitudes significantly less than the magnitude of the smallest quantum level. For the example of 256 non-equal quantum levels, this requires a folding accuracy of 4,000 to 1. With this accuracy requirement, the constant error introduced by the variations in the coding network resistors, for example, becomes a major obstacle. For the illustration of 256 quantum levels, a resistor accuracy of 0.01 percent or better would be required to achieve the desired coding accuracy. Such accuracy is, at the present state of the art, impractical to achieve or maintain. The result of using components presently obtainable is coding inaccuracy which in turn results in signal crossover distortion and high idle circuit noise.

It is therefore an object of this invention to provide a current folder circuit comprising a differential amplifier that achieves desired coding accuracies using components readily available from commercial sources.

SUMMARY OF THE INVENTION

The differential amplifier current folder and coder circuit of the present invention is dynamically biased in accordance with the magnitude of the input signal to the differential amplifier. Since the biasing current through the main coding paths of the folder and coder circuitry is reduced for lower magnitudes of input signal, the current dependent error introduced as, for example, due to the $I\Delta R$ voltage drop due to resistor variations, varies in accordance with the magnitude of the input signal. Thus the error remains approximately the same as for constant current biased structures for high magnitudes of input signal where the error can be tolerated, but unlike the constant current biased structures, is appreciably reduced for lower magnitudes of input signal to a level where it can also be easily tolerated. The reduction in the error for lower magnitudes of input signal permits a substantial relocation in the required component tolerances and enables the use of thin film components as well as components readily available from commercial sources.

In the current folder and coder circuit of the present invention, first and second transistors are d.c. biased for operation as a differential amplifier with one of the transistors connected to receive the input signal. The collector-emitter paths of these transistors are connected in parallel by a differential switch and a weighting and coding network to a source of bias. The common connection of the emitter electrodes of these transistors is connected to a dynamic bias control network which is also connected to receive the input signal so as to control the current flow through the differential amplifier transistors in accordance with the magnitude of the input signal to the differential amplifier.

The current folder and coder circuit discussed in detail hereinafter thus comprises a weighting and coding network, a differential switch, a differential amplifier, a transistor of a dynamic bias control circuit, and a bias circuit all serially connected in a main coding path to a source of biasing potential. The transistor of the dynamic biasing control network has its collector-emitter path serially connected in the main coding path and its base electrode connected with the differential amplifier to receive the input signal. A second transistor of the dynamic bias control circuit has its collector-emitter path connected from the source of biasing potential to the bias circuit to provide an alternate path to the coding path for the constant current maintained by the bias circuit for other than peak input signal magnitudes. This is accomplished by connecting the base electrode of the second transistor to the input signal so as to control inversely the alternate path current through the collector-emitter path of this second transistor in accordance with the magnitude of the input signal.

Longitudinal compensation is also provided in the current folder circuit of the present invention to compensate for large voltage swings which translate from longitudinal to transverse voltages in the weighting and coding network. This network is connected between the weighting and coding network and the source of positive bias potential to compensate for the large voltage swings that would occur in the potential across the coding network due to an abrupt change of current through the coded network as, for example, that which might be caused by the sudden presence of a large magnitude input signal.

BRIEF DESCRIPTION OF THE DRAWING

Other objects and features of the present invention will be apparent from the following discussion and drawing, the single FIGURE of which is a current folder and coder embodiment of the dynamically biased differential amplifier of the present invention.

DETAILED DESCRIPTION

The current folder circuit employing the present invention as illustrated in the single figure of the drawing, comprises five basic networks shown in dotted enclosures: the weighting and coding network, the longitudinal compensation circuit, the differential amplifier, the dynamic bias control, and the bias circuit.

In the circuit illustrated in the drawing the input signal to be folded and coded, designated as an input source 1, is coupled by a capacitor 2 both to the input to the dynamic bias control network and to the input to the differential amplifier. The input signal source 1 is also directly connected to a driving circuit 3 which is in turn connected to the differential switch.

The signal coupled to the dynamic bias control circuit through the capacitor 2 is applied to the input of an amplifier 4. Full wave rectifier 5 has its input terminals connected to the output of amplifier 4 and ground. A resistor 14 is connected across the output terminals of the full wave rectifier 5. One output terminal of the rectifier 5 terminal is connected to the base electrode of transistor 6, while the other rectifier output terminal is connected to the base electrode of transistor 7. Biasing resistor 8 is connected to the emitter electrode of transistor 6 and biasing resistor 9 is connected to the emitter electrode of transistor 7. Resistors 8 and 9 are interconnected to the collector electrode of transistor 10 of the bias circuit. These resistors are chosen in accordance with the desired quiescent current flow through each of transistors 6 and 7.

The bias circuit maintains a constant current flow therethrough. In this bias circuit, the emitter of transistor 10 is connected to a source of negative bias potential by the current limiting resistor 11. The base electrode of transistor 10 is connected both to a source of positive potential by current limiting resistor 12 and to the negative source of biasing potential by a zener diode 13 connected for reverse conduction from the base of transistor 10 to the source of negative bias potential.

The input signal to the folder circuit is coupled by capacitor 2 to the base electrode of differential amplifier transistor 15. A d.c. bias resistor 16 connects the base electrode of transistor 15 to ground and another bias resistor 17 connects the emitter electrode of transistor 15 to the collector electrode of transistor 6 of the dynamic bias control network. Transistor 18 is the second transistor of the differential amplifier which, as illustrated in FIG. 1, in unbalanced. The base electrode of transistor 18 is connected to ground by d.c. bias resistor 19 and its emitter electrode is connected to the collector electrode of transistor 6 of the dynamic bias control network by resistor 20. The magnitude of resistors 17 and 20 may normally be equal as may the magnitude of resistors 16 and 19. These four resistors are chosen to provide the desired quiescent bias to provide a substantially zero output signal in the absence of an input signal.

The driving network 3 has its input connected to the source of input signal 1 and has dual outputs, one of the outputs being connected to the base electrodes of differential switch transistors 21 and 22 and the other output to the base electrodes of differential switch transistors 23 and 24. The emitter electrodes of transistors 21 and 23 are interconnected to the collector electrode of transistor 15 of the differential amplifier and the emitter electrodes of transistors 22 and 24 are interconnected to the collector electrode of transistor 18 of the differential amplifier. The collector electrodes of transistors 21 and 24 are connected to the positive input of the comparator 25, and the collector electrodes of transistors 22 and 23 are connected to the negative input of comparator 25. The output of the comparator 25 is connected to the driving circuit 3 to synchronize this circuit with the polarity of the compared signal to be coded. The output of comparator 25 is also connected to the logic circuit 26, the output of which is the digital representation of the analog input signal. The logic circuit 26 is connected to the weighting network 27, the function of which will be discussed hereinafter. Weighting network 27 is also connected to the positive input of the comparator 25 by resistor 28, where resistor 28 represents source resistance of the weighting network. Resistor 29, which will normally have the same magnitude as resistor 28, connects the emitter electrode of longitudinal compensation transistor 30 to the negative input of comparator 25. The weighting network 27 is also connected to the emitter electrode of longitudinal compensation transistor 30. The collector electrode of longitudinal compensation transistor 30 is connected to a source of positive biasing potential and the base electrode of this transistor is connected to this source of positive potential by resistor 31.

Before discussing the function of each of these components in detail, it is first useful to review briefly the functions of each network in the overall current folder and coder circuit of the drawing. The driving network 3 drives the differential switch according to the polarity at the input signal source 1. The function of the differential switch is that of "folding," i.e., providing the single polarity inputs to the comparator 25 illustrated in the drawing regardless of the polarity of the alternating signal input from the source 1. The driving circuitry would be synchronized with the source 1 and output of comparator 25 such that the signal driving the differential switch would be the same in both polarity and frequency as that of the source 1. One skilled in the art could readily develop a compatible driving circuit for this purpose as, for example, flip-flops which are synchronized and zero-set with the frequency and polarity of the input signal.

The differential amplifier amplifies the input signal, the operation of this circuit, which is unbalanced in the configuration illustrated in the drawing, being well known in the art. The dynamic bias control circuit controls the bias of the differential amplifier in accordance with the magnitude of the input signal in a manner to be discussed in detail hereinafter. The bias circuit maintains a constant current flow therethrough, the magnitude of this current being determined in accordance with maximum bias current required for a peak magnitude input signal. The longitudinal compensation circuit compensates for large voltage swings which may be translated from longitudinal to transverse voltages, and thereby introduce error, at the input of the comparator 25.

The coding of the analog input signal is accomplished by comparing the voltages or currents proportional to the input analog signal with one of a plurality of reference voltages or currents generated by the weighting network. The results of this comparison are then fed to a logic circuit for arrangement as a PCM code word. This weighting and coding network is simply a digital-to-analog converter, many types of which are well known in the art, as can be seen, for example, from the textual material at pages 583 through 585 of the text *Transmission Systems for Communications*, fourth edition, by Members of the Technical Staff — Bell Telephone Laboratories. More particularly, the current flow through resistors 28 and 29 is varied in accordance with the magnitude of the input signal, as discussed in detail hereinafter. The variation in the voltages across these resistors is compared with the reference outputs of the weighting network by the comparator 25 and fed to the logic circuitry for encoding as a PCM word. The weighting network 27 may be any compatible network as, for example, the resistive ladder and switching network shown in FIG. 25–13 at page 584 of the aforenoted *Transmission Systems for Communications* text. This network produces a number of voltages or currents at predetermined steps under the control of the logic circuit 26 until the voltage across resistor 29 is greater than the sum of the voltages across the weighting network 27 and resistor 28. The logic circuit than resets the weighting network and the process is repeated for the next input sample. The logic circuit also encodes the output signal from the comparator as a PCM word.

The detailed operation of each of the components of the folder circuit with dynamic bias illustrated in the drawing is most easily explained by first examining the condition of the circuit in the absence of an input signal. For this no-signal or quiescent condition, the transistors 15 and 18 of the differential amplifier are biased such that substantially equal collector-emitter currents, shown on the drawing as $I_{b1}$ and $I_{b2}$, flow through the respective collector-emitter paths of each of these transistors. The current through transistor 6 of the dynamic bias control circuit is thus the sum of the collector-emitter currents of the two transistors 15 and 18. The current into the bias circuit comprising transistor 10 is maintained at a constant magnitude $I_a$, the bias circuit being a constant current regulator as noted heretofore. The current through the collector-emitter path of transistor 7 must, therefore, be the difference between the constant current $I_a$ and the current through transistor 6 or $I_a - (I_{b1} + I_{b2})$, as shown in the drawing.

Before discussing the change in the currents due to the presence of a signal input, it is first useful to explain briefly the need for dynamic biasing in the folder circuit illustrated in the drawing. In a circuit without the dynamic bias control network, the common connection of resistors 17 and 20 would be connected directly to the collector electrode of transistor 10 of the bias circuit. In the absence of an input signal to this circuit. In the absence of an input signal to this circuit without dynamic bias, balanced and equal currents would flow from the source of positive potential at the top of the drawing to the source of negative potential at the bottom of the drawing through two arms or paths which together form a main coding path. The left arm of this coding path would comprise transistor 30, weighting network 27, resistor 28, transistor 21, transistor 15, resistor 17, transistor 10, and resistor 11, while the right arm of the coding path includes transistor 30, resistor 29, transistor 22, transistor 18, resistor 20, transistor 10 and resistor 11. The sum of the currents in each arm of the main coding path of this modified circuit will of course always equal the constant current maintained by transistor 10 of the bias circuit. Since the voltage error in the folding and coding process is limited to a voltage having a magnitude less than the voltage level of the lowest quantum level, the ΔR variations in the resistors in the weighting and coding network must be limited to:

ΔR = smallest permissible voltage error/constant current bias where the relatively large magnitude of the constant bias current required is dictated by the biasing current necessary for peak signal magnitudes when substantially all of this current will flow through one or the other arms of the main coding path, depending on the polarity of the input signal, as discussed hereinafter. For example, for the 256 quantum level and 3 volt peak amplitude input signal illustration used heretofore, this would require that resistors 28 and 29 have tolerances of 0.012 percent or better to limit the IΔR voltage error drop in these resistors to acceptable levels, where ΔR represents the actual difference or variation in resistance between resistors 28 and 29. In addition, the transistors 15 and 18 of the differential amplifier, and transistors 21, 22, 23, and 24 of the differential switch, must be chosen to have essentially zero base-emitter bias currents lest unbalance in these currents unbalance the currents in each arm of the coding path and thereby introduce error. Resistors having tolerances of 0.012 percent and transistors having substantially zero base-emitter leakage currents are, however, not available at the present state of the art. The manner in which dynamic biasing is employed in the present invention relieves the need for these unobtainable components and enables the fabrication of a folder and coder circuit using thin film techniques.

The function of dynamic biasing in the present invention can be seen by assuming the presence of a relatively large magnitude positive input signal at the output of the source 1. This large magnitude input signal is coupled via capacitor 2 to the base of transistor 15 and causes the magnitude of the current flow $I_{b1}$ through the collector-emitter path of transistor 15 to increase. The positive input signal is also coupled to amplifier 4 by capacitor 2 where it is amplified and fed to full wave rectifier 5. The signal appearing across resistor 14, which is connected across the output terminals of the full wave rectifier 5, has the polarity shown in the drawing and causes the conduction through transistor 6 to increase. (The base currents of transistors 6 and 7 are sufficiently small to be considered negligible for present purposes.) Increased current through transistor 6 causes the current through the collector-emitter path of transistor 7, which is the difference of the constant current $I_a$ of the bias current comprising transistor 10 minus the current through transistor 6 ($I_{b1}$ + $I_{b2}$), to decrease proportionally. The current flow from the source of positive potential at the top of the drawing is thus through the collector-emitter path of transistor 30 where the current branches into the two arms of the main coding path, the first of which comprises weighting network 37, resistor 28, the collecting-emitter path of transistor 21, the collector-emitter path of transistor 15, and resistor 117, while the second arm comprises resistor 29, the collector-emitter path of transistor 22, the collector-emitter path of transistor 18, and resistor 20. The currents re-combine at the junction of resistors 17 and 20 and flow through the collector-emitter path of transistor 6 and resistor 8 of the bias circuit. For the assumed relatively large magnitude input signal, the current $I_{b1}$ will be greater than the current flow $I_{b2}$. The second current path from the source of positive potential at the top of the drawing is through resistor 31, the collector-emitter path of transistor 7 and resistor 9. The current in these paths from the positive source of potential combine at the junction of resistors 8 and 9 and are equal to the constant current $I_a$ maintained by the bias circuit. The errors due to resistor and transistor tolerances introduced in the left and right "arms" of the main coding path comprising resistors 28 and 29, respectively, will for this input signal magnitude thus be approximately the same as if the dynamic bias control circuit were not employed. Since the input magnitudes are large, however, these errors are proportionally small, introduce very little error in the coding or quantizing process and may therefore be tolerated.

In the event of an input signal having a relatively small magnitude, however, the errors introduced by parameter tolerances are proportionally quite significant and may even exceed the magnitude of the signal to be coded if the sum of the currents in the arms of the main coding path is constricted to the magnitude $I_a$ dictated by the bias current necessary for peak input signal conditions as would be the case if dynamic biasing were not employed. Since transistor 6 of the dynamic biasing circuit of the present invention controls the current flow through the main coding path in accordance with the magnitude of the input signal, however, the dynamic biasing circuit reduces the errors proportional to the current in the main coding path, such as the IΔR and transistor leakage current errors to the same insignificant, and tolerable, portions of the input signal. With the present invention, therefore, the errors introduced due to current dependent parameter variation are minimal for all input signal conditions rather than just for a high input signal condition. The detailed operation of the present circuit in the presence of a relatively small input signal is discussed in detail in the following paragraphs.

The relatively small input signal magnitude causes conduction through transistor 6 of the dynamic bias control circuit to be reduced thereby decreasing the current flow through the main coding path comprising resistors 28 and 29 and transistors 15 and 18. Since the combined bias current at the junction of resistors 8 and 9 is maintained constant by the bias circuit comprising transistor 10, the current flow through the collector-emitter path of transistor 7 is increased proportionally. Reducing the current flow in the main coding path reduces the IΔR drop or error due to the variations between the resistances of resistors 28 and 29 and 17 and 20 to a proportionally small value and also reduces the base-emitter bias currents in each of transistors 15, 18, 21, 22, 23, and 24. The reduction in the error thus obtained enables the desired coding to be performed with the required accuracy using either commercially available components or thin film techniques. It should be noted that the constant bias current $I_a$ is always available for any instantaneous input signal, be it large or small, and that the coding process is not impaired in any way by the use of the dynamic bias.

The operation of the circuit of the present drawing for negative input signals is substantially similar. In the presence of a negative input signal the driving circuit 3 biases transistors 23 and 24 of the differential switch into conduction and transistors 21 and 22 into cutoff. The negative input signal at the base of transistor 15 of the differential amplifier decreases conduction into this transistor and increases conduction through transistor 18. The magnitude of the current $I_{b2}$ now exceeds the magnitude of the current $I_{b1}$. The $I_{b1}$ current flows from the source of positive potential at the top of the drawing through the collector-emitter path of transistor 30, the resistor 29, the collector-emitter path of transistor 23, the collector-emitter path of transistor 15, resistor 17, the collector-emitter path of transistor 6, and resistor 8 to the bias circuit comprising transistor 10. The $I_{b2}$ current flows from the source of positive potential at the top of the drawing through the weighting network 27, the resistor 28, the collector-emitter path of transistor 24, the collector-emitter path of transistor 18, resistor 20, the collector-emitter path of transistor 6, and resistor 8, again to the bias circuit comprising transistor 10. The alternate conduction through transistors 21 and 22 for positive magnitude input signals and transistors 23 and 24 for negative magnitude input signals provides the desired "folding" action such that the polarity of the input signal to the comparator 25 is the same regardless of the polarity of the input signal. The operation and advantages of the dynamic bias control circuit is the same for either polarity of input signal.

The longitudinal compensation circuit compensates for the large voltage swings which may be translated from longitudinal to transverse voltages and thus introduce error at the input of comparator 25. If, for exemplary purposes, it is assumed that a large positive or negative input signal is present at the output of source 1, then, as discussed heretofore, the current flow through the collector-emitter path of transistor 30 increases and correspondingly the current through resistor 31 decreases since transistor 7 in the dynamic bias circuit is now drawing less current due to the increase of current through transistor 6 caused by the large input signal. This decreased current flow through resistor 31 causes the voltage across the collector-emitter path of transistor 30 to drop, thereby raising the potential at the common node formed by the interconnection of the emitter electrode of transistor 30, the weighting network 27, and the resistor 29 to a value closer to the magnitude of the source of positive potential than the potential at the common node before the application of the increased input signal. The abrupt change in potential across the resistors 28 and 29, due to the increased current surge due to the presence of a large input signal magnitude, is thus offset by the rise in potential at the aforenoted common node. The average voltage at the common node is thus kept relatively constant. The comparison at comparator 25 of the voltages across and currents through weighting network 27 and resistors 28 and 29 is due solely to the change in current in one or the other of the coding paths and longitudinal to transverse voltage conversion and the error associated therewith is substantially avoided.

Although the dynamic bias control circuit of the present invention is shown in combination with an unbalanced differential amplifier, this arrangement could obviously also be used with a balanced differential amplifier simply by coupling the input to the amplifier in the dynamic control circuit to both sources of input signal. Additionally, although the differential amplifier and dynamic biasing circuit is here illustrated in a folder and coder environment it could just as easily be used in any differential amplifier application where dynamic biasing is required. For example, the circuit could be used in a "unfolder" circuit with the weighting network interchanged with the input source 1 and the comparator 25 replaced by a differential operational amplifier. In this application, the coupling capacitor 2 would be eliminated and full wave rectifier 5 and resistor 14 would not be required since the output of the weighting network is normally of one polarity only.

The above-described arrangement is illustrative of the application of the principles of the invention. Other embodiments may be devised by those skilled in the art without departing from the spirit and scope thereof.

What is claimed is:

1. A dynamically biased amplifier comprising first and second transistors, d.c. biasing means connected to the base and emitter electrodes of each of said first and second transistors to bias said first and second transistors for operation as a differential amplifier, an input signal to be differentially amplified connected to the base electrode of said first transistor, a third transistor, a source of biasing current for maintaining a constant current therethrough, means connecting the collector-emitter paths of said first and second transistors in parallel, means serially connecting the parallel combination of the collector-emitter paths of said first and second transistors, the collector-emitter path of said third transistor, and said source of constant biasing current, a fourth transistor having its collector-emitter path connected across said source of biasing current to provide an alternate current path for a portion of the constant current maintained by said source of biasing current and means connecting said input signal to the base electrode of said third transistor and to the base electrode of said fourth transistor to vary the biasing current flow through the parallel collector-emitter paths of said first and second transistors in proportion with the magnitude of said input signal and to vary the current flow through the collector-emitter path of said fourth transistor in inverse relationship to the magnitude of said input signal, the current flow in the collector-emitter path of said fourth transistor being equal to the difference between the constant current maintained by said source of biasing current and the biasing current flow through the parallel collector-emitter paths of said first and second transistors.

2. A dynamically biased amplifier in accordance with claim 1 wherein said means connecting said input signal to the base electrode of said third transistor and to the base electrode of said fourth transistor includes a full wave rectifier having its positive output terminal connected to the base electrode of said third transistor and its negative output terminal connected to the base electrode of said fourth transistor.

3. A current folder and coder circuit comprising an unbalanced differential amplifier, a weighting and coding network connected to a comparator and logic circuit to control the reference signal from said weighting and coding network in accordance with the signal at the input of said comparator, a differential switch, a dynamic bias control network, a bias circuit, a source of biasing potential, means serially connecting said source of biasing potential, said weighting and coding network, said differential switch, said unbalanced differential amplifier, said dynamic bias control network, and said bias circuit, a source of input signal, driving circuit means connected to said source of input signal and said differential switch to drive said differential switch in accordance with the polarity and frequency of said input signal, means connecting said unbalanced differential amplifier to said input signal source, and means connecting said dynamic bias control network to said input signal source to vary the current through the main coding path comprising said weighting and coding network, said differential switch, and said unbalanced differential amplifier in accordance with the instantaneous magnitude of the input signal from said input signal source.

4. A current folder and coder circuit comprising an unbalanced differential amplifier in accordance with claim 3 wherein a longitudinal compensation circuit is connected between said source of biasing potential and said weighting and coding network to compensate for the large voltage swings across said weighting and coding network in response to a large magnitude input signal.

5. A current folder and coder circuit comprising an unbalanced amplifier in accordance with claim 3 wherein said unbalanced differential amplifier comprises first and second transistors biased for operation as a differential amplifier, means connecting the source of input signal to the base electrode of said first transistor, means interconnecting the emitter electrodes of said first and second transistors, means including said differential switch and said weighting and coding network connect the collector electrodes of said first and second transistor in parallel in a main coding path to said source of bias potential, and said dynamic bias control circuit comprises at least a third transistor having its base electrode connected to said source of input signal and its collector-emitter path serially connected between the emitter electrodes of said first and second transistors and said bias circuit.

6. A current folder and coder circuit comprising an unbalanced differential amplifier in accordance with claim 5 wherein said dynamic biasing circuit includes a fourth transistor, means connecting the collector-emitter path of said fourth transistor from said source of biasing potential to said bias circuit, said bias circuit maintains a constant bias current, and means connecting the base electrode of said fourth transistor to said source of input signal to vary the current flow through the collector-emitter path of said fourth transistor in inverse relationship to the magnitude of the input signal from said input signal source and the current flow through the collector-emitter path of said third transistor.

7. A coder circuit comprising an unbalanced differential amplifier, a weighting and coding network connected to a comparator and logic circuit to control the reference signal from said weighting and coding network in accordance with the signal at the input of said comparator, a dynamic bias control network, a bias circuit, a source of bias potential, means serially connecting said source of biasing potential, said weighting and coding network, said unbalanced differential amplifier, said dynamic bias control network, and said bias circuit, a source of input signal, means connecting said unbalanced differential amplifier to said input signal source, and means connecting said dynamic bias control network to said input signal source to vary the current through the main coding path comprising said weighting and coding network, and said unbalanced differential amplifier in accordance with the instantaneous magnitude of the input signal from said input signal source.

* * * * *